(12) United States Patent
Hoshino et al.

(10) Patent No.: US 6,270,356 B1
(45) Date of Patent: Aug. 7, 2001

(54) IC SOCKET

(75) Inventors: Masayoshi Hoshino; Masakazu Yayoshi, both of Tokyo (JP)

(73) Assignee: Tokyo Eletech Corporation, Tokyo (JP)

( * ) Notice: Subject to any disclaimer, the term of this patent is extended or adjusted under 35 U.S.C. 154(b) by 0 days.

(21) Appl. No.: 09/592,173

(22) Filed: Jun. 12, 2000

(30) Foreign Application Priority Data

Jun. 14, 1999 (JP) .................................................. 11-167400

(51) Int. Cl.[7] .................................................. H01R 12/00
(52) U.S. Cl. .............................................. 439/70; 439/912
(58) Field of Search ................................ 439/70, 71, 66, 439/591, 912

(56) References Cited

U.S. PATENT DOCUMENTS

| | | | | |
|---|---|---|---|---|
| 4,508,405 | * | 4/1985 | Damon et al. | 439/66 |
| 5,174,763 | * | 12/1992 | Wilson | 439/66 |
| 5,205,741 | * | 4/1993 | Steen et al. | 439/70 |
| 5,727,954 | * | 3/1998 | Kato et al. | 439/66 |
| 6,036,503 | * | 3/2000 | Tsuchida | 439/70 |

* cited by examiner

Primary Examiner—Tulsidas Patel
(74) Attorney, Agent, or Firm—Sculy, Scott, Murphy & Presser (57) ABSTRACT

A small and thin IC socket allowing BGA/LGA IC package to be connected to a printed circuit board is disclosed. The IC socket includes a socket body having a plurality of main through-holes formed between the top and bottom surfaces thereof, corresponding to respective ones of the terminals of the IC. In each of the main through-holes, a pair of an upper contact member and a lower contact member which are accommodated and are electrically connected to each other. At least the upper contact member is slidably accommodated and biased to protrude from the top surface of the body. An external connection printed circuit board is fixed to the top surface of the socket body and has a plurality of upper plated through-holes corresponding to respective ones of the main through-holes. The upper contact member protrudes through a corresponding one of the upper through-holes and is electrically connected to a corresponding one of wiring conductors.

11 Claims, 5 Drawing Sheets

FIG. 5 ical circuit on the printed circuit board.
IC SOCKET

BACKGROUND OF THE INVENTION

1. Field of the Invention

The present invention relates to an IC (integrated circuit) socket, and in particular to an IC socket that accommodates a surface-mount IC package such as a ball-grid-array (BGA) package or land-grid-array (LGA) package and is mounted on a printed circuit board so as to electrically connect the integrated circuit of the surface-mount IC package to an electrical circuit on the printed circuit board.

2. Description of the Prior Art

With the increased density of an electronic circuit, large-scale integrated circuits and the like are widely used. Such a high-density device has a large number of lead-out terminals provided on the bottom face thereof in a predetermined pattern and therefore surface mounting has become standard.

With improvements in terminal lead-out shapes and shortening of the pitch between terminals, a BGA-type terminal shape is frequently employed in the case of the pitch being 0.65 mm, 0.5 mm, or 0.4 mm.

Figure 1A:
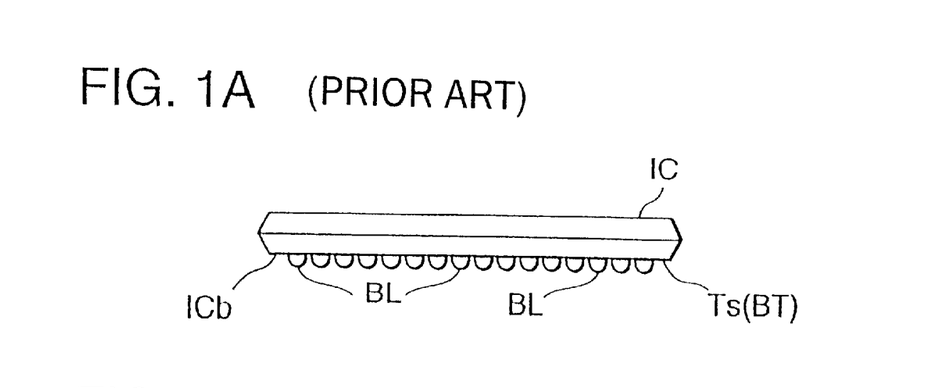
FIG. 1A is a side view of an example BGA-type IC package which may be accommodated in an IC socket.
Figure 1B:
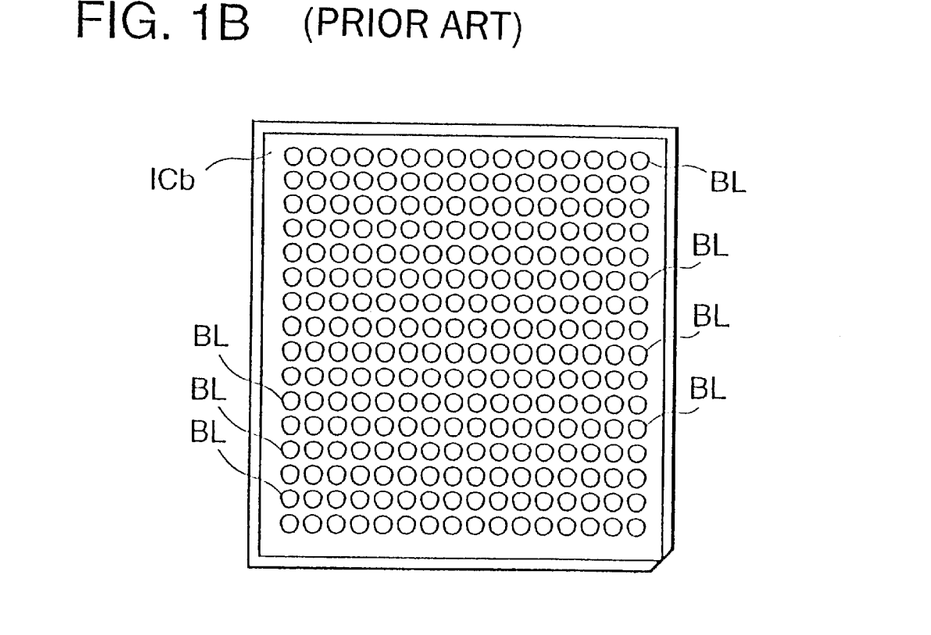
FIG. 1B is a bottom view of the example BGA-type IC package of FIG. 1A.

FIG. 1A is a side view of an example of BGA-type IC and FIG. 1B is a bottom view thereof. In the BGA-type IC, metal terminals BT are arranged in matrix form in the entire central portion of the bottom surface ICb of a mold portion. Each of the metal terminals is connected as necessary to an inside integrated circuit portion. For mounting, solder balls BL (bumps) are attached to the bottom planar portions Ts of the respective metal terminals BT. At the time of mounting, the IC is placed at a prescribed position on a printed circuit board and is heated in a reflow furnace or the like. As a result, the solder balls BL melt and solder connections are made between the terminals and prescribed portions of wiring patterns on the circuit board (surface mounting).

There is another type of package called a land grid array (LGA) in which a solder material for connection is prepared on a printed circuit board and the bottom planar portions of micro-terminals of an IC package are exposed. An IC package employing BGA or LGA that are slightly larger than the integrated circuit portion may be called a chip size package (CSP).

With a background situation that surface-mount ICs that are expensive and high in integration density and have a very large number of terminals have come to be widely used, there are cases that even a surface-mount IC is attached to a printed circuit board by using an IC socket to protect such an expensive IC from unnecessary mechanical or electrical stress that may occur during a printed circuit board manufacturing process. The use of an IC socket is also meaningful for the purpose of facilitating exchange of an IC that has failed, for example.

In the case of designing and developing a printed circuit board using a high-density component, the high-density component is completed and thereafter the printed circuit board is designed using the completed high-density component. However, this procedure increases the development period and takes long time to complete the printed circuit board having desired performance. To shorten the development period, the printed circuit board is designed parallel with the development of the high-density component. In this case, the test is performed by connecting a number of signal lines to dense terminal lands in a region on the printed circuit board where to place the high-density component. However, work of connecting those signal lines is difficult because it needs to be performed on a very large number of dense connecting points.

Using an IC socket that makes it possible to easily output individual signals to outside and further makes desired electrical connections to the dense lands very easily with high reliability, the development period of a circuit board may be shortened and sufficient trial production and experiment is allowed.

In BGA-type or LGA-type ICs, however, only limited structures are available for an IC socket that can make correspondence to terminal positions that are densely arranged in matrix form. Further, few sockets are available that make it possible to lead out IC terminals to the outside.

Figure 2:
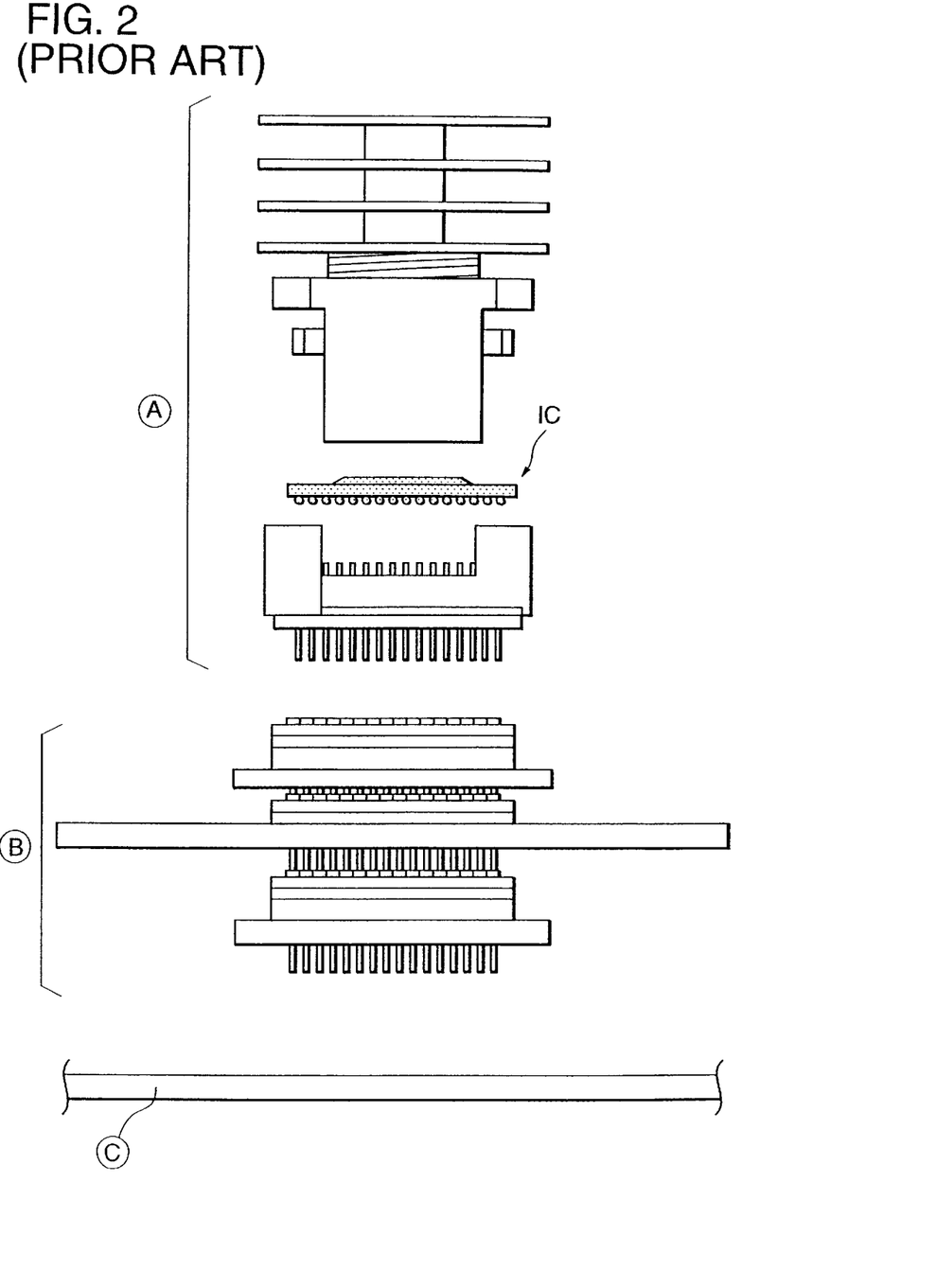
FIG. 2 is an exploded side view of a conventional IC socket.
Figure 3:
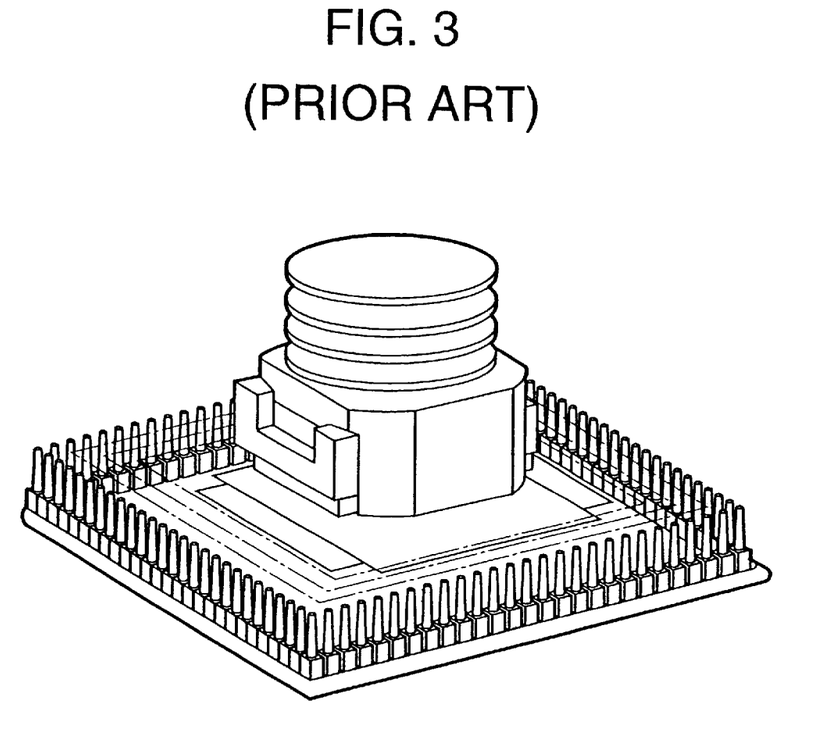
FIG. 3 is a perspective view showing an appearance of the conventional IC socket.

FIG. 2 is an exploded side view showing individual components of a conventional IC socket. FIG. 3 is a perspective view showing an appearance of an example of the conventional IC socket that can be used for the above purpose.

Referring to FIG. 2, reference symbol "A" denotes a BGA socket portion for accommodating a BGA IC and reference symbol "B" denotes an adapter board portion for leading out IC terminals. Reference symbol "C" denotes a printed circuit board to which the IC socket is to be attached.

However, the conventional IC socket is disadvantageous in that it is increased in size and hence can be used at limited locations. Further, the conventional IC socket also has a problem that the number of components is large. Furthermore, since the conventional IC socket has PGA terminals for attachment to a printed circuit board, a different printed circuit board needs to be provided for mounting of an actual IC. To deal with digital ICs that operate at extremely high frequencies, connection path lengths need to be shortened and in particular a thin IC socket is required; that is, an IC socket is desired that has a terminal connection structure and a socket structure such that reduction in thickness and sufficient performance can be both achieved.

SUMMARY OF THE INVENTION

An object of the present invention is to provide an IC socket that properly accommodates a BGA/LGA surface-mount IC, allowing reduced thickness and easy and reliable input/output of signals.

According to the present invention, an integrated circuit (IC) socket for electrically connecting terminals of an IC to respective ones of predetermined electrodes of a printed circuit board, includes: a body member made of an insulating material, the body member having a top surface and a bottom surface thereof, wherein a plurality of main through-holes are formed between the top surface and a bottom surface so that the main through-holes correspond to respective ones of the terminals of the surface-mount IC package; a pair of an upper contact member and a lower contact member which are accommodated in each of the main through-holes and are electrically connected to each other so as to electrically connect the terminals of the surface-mount IC package to respective ones of the predetermined electrodes of the printed circuit board, wherein at least the upper contact member is slidably accommodated and biased to protrude from the top surface of the body member; and a board member fixed to the top surface of the body member, the board member having a plurality of upper plated through-holes corresponding to respective ones of the main through-holes, wherein the upper contact member protrudes through a corresponding one of the upper through-holes by a predetermined length.

The board member may further have a plurality of conductors which are electrically connected to respective ones of the main through-holes, wherein the upper contact member protrudes through the corresponding one of the upper through-holes and is electrically connected to a corresponding one of the conductors. The board member may be an external connection printed circuit board.

As an aspect of the present invention, both of the upper and lower contact members are slidably and coaxially accommodated in each of the main through-holes and biased by a biasing element in such directions as to be relatively separated from each other.

As another aspect of the present invention, the upper contact member is slidably and coaxially engaged with the lower contact member in each of the main through-holes and the upper contact member is biased by a biasing element in such directions as to be relatively separated from the lower contact member.

To attain the above object, the invention provides an IC socket for connecting input/output terminals of a BGA IC accommodated inside the IC socket to prescribed IC terminal connection electrodes on a mounting printed circuit board, comprising a socket base made of an insulating material to be disposed in an IC terminals connection region that is located at a prescribed position on a surface of a mounting printed circuit board; socket fixing means for fixing the socket base to the mounting printed circuit board; an external connection printed circuit board that is fixed to a top surface of the socket base; and IC fixing means for fixing a BGA IC that is placed at a prescribed position on the external connection printed circuit board by pressing the BGA IC from above. The socket base comprises upper contact pins that are provided at positions corresponding to respective terminal positions of the BGA IC placed and accommodated on a top surface of the socket base and that are biased individually inside the socket base and project, by a prescribed length, from the top surface of the socket base and pass through through-holes of the external connection printed circuit board; and lower contact pins that are electrically connected to the respective upper contact pins, and that are biased individually inside the socket base and reach a bottom surface of the socket base and protrude at positions corresponding to IC terminal connection electrodes provided on the mounting printed circuit board. The external connection printed circuit board has the through-holes in which the respective upper contact pins are inserted and surface wiring portions that are insulated from each other, are electrically connected to the respective upper contact pins, and are provided on a surface of the external connection printed circuit board so as to extend to an outer periphery. In this, manner, the invention can realize an IC socket for a BGA terminal IC which is small in size and thin and enables input/output of signals with an external system.

An upper contact pin and a lower contact pin that are associated with each other are arranged coaxially and biased by biasing means in such directions as to be separated from each other. In particular, the IC socket may be configured in such a manner that the socket base is formed, in a thickness direction, in a prescribed arrangement, with a plurality of through-holes each of which has an upper portion having a constant diameter and a lower portion having a smaller diameter with a step formed inbetween; that a surface of the external connection printed circuit board is formed with conductor lands at positions corresponding to the respective through-holes in a state that the external connection printed circuit board is fixed to the socket base in a prescribed manner, the lands being connected to one ends of the respective wiring portions, the through-holes having a diameter smaller than the constant diameter being formed approximately at central positions of the respective lands; and that each of the lower contact pins has a brim at a middle position in an axial direction, each of the upper contact pins has a brim at a middle position in the axial direction, a first coiled spring is interposed between the brims in a compressed and deformed state and accommodated in the through-hole coaxially, being biased by resilient force of the first coiled spring, a bottom tip of the lower contact pin projects from the bottom surface of the socket base and a top tip of the upper contact pin projects from a top surface of the connection printed circuit board.

The IC socket may be configured in such a manner that one of the upper contact pin and the lower contact pin has a shaft extending inward in the axial direction from the brim; that the other contact pin has a cylinder portion that extends inward in the axial direction from the brim and accommodates the shaft slidably or in a loosely fit state; and that the first coiled spring is mounted on outer circumferential surfaces of the shaft and the cylinder portion and both ends of the first coiled spring are in contact with the respective brims.

The IC socket may further comprise an internal cylinder member that is slidably mounted on an outer circumferential surface of a portion of the upper contact pin located above the brim in the axial direction and has a brim at an upper end in the axial direction; and a second coiled spring that is mounted on an outer circumferential surface of the internal cylinder member and provided in a compressed state in such a manner that both ends of the second coiled spring are brought into contact with the brim of the upper contact pin and the brim of the internal cylinder member by biasing force weaker than that of the first coiled spring. This structure makes reliable the connections between the upper contact pins and the lands formed on the external connection printed circuit board.

The IC socket may further comprise a connector that is provided at the outer periphery of the external connection printed circuit board, wherein the wiring portions are electrically connected to respective connection pins of the connector. This structure improves the ease of use of input/output lines that are led out to the outside from the TC terminals.

DESCRIPTION OF THE PREFERRED EMBODIMENTS

The present invention will be hereinafter described in detail with reference to the drawings, where members having the same or similar function are denoted by the same reference numerals or symbols.

Figure 4A:
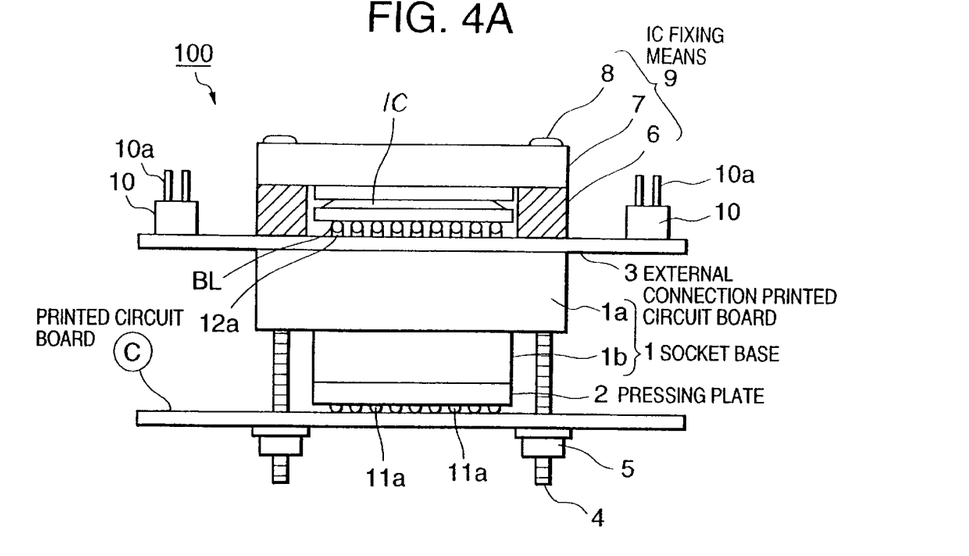
FIG. 4A is a partially sectional side view of an IC socket according to a first embodiment of the present invention.

Referring to FIG. 4A, the IC socket 100 is capable of accommodating a surface-mount (BGA/LGA) IC package (hereafter, simply called an IC). The IC socket 100 having the IC mounted therein is fixed on a printed circuit board C and thereby electrically connects the IC to the predetermined terminals of a circuit pattern formed on the printed circuit board C, allowing input/output of signals between them.

The IC socket 100 according to the first embodiment is provided with a socket base 1 composed of an upper portion 1a and a lower portion 1b, which are integrated with each other and are made of an insulating material such as a heat-resistant polymer. The lower portion 1b has a prescribed thickness and a shape (e.g., rectangular in cross-section) approximately equal to the plan view of the IC. The upper portion 1a has a prescribed thickness and a rectangular sectional shape as would be obtained by expanding the lower portion 1b outward approximately uniformly. The lower portion 1b has a pressing plate 2 fixed to the bottom surface thereof.

The IC socket 100 is fixed to the printed circuit board C by a socket fixing means consisting of fixing screws 4 and fixing nuts 5. The fixing screws 4 are embedded in the upper portion 1a at four corner positions so as to extend downward.

The upper portion 1a of the socket base 1 has an external connection printed circuit board 3 fixed to the top surface thereof. The IC is placed at a predetermined position on the external connection printed circuit board 3 and is fixed by an IC fixing means 9 composed of a spacer 6, a lid 7, and fixing screws 8.

The spacer 6 is made of an insulating material and has a frame shape of a prescribed thickness in which a penetration space is formed at the center so as to conform to the outer shape of the IC. The lid 7 is made of an insulating material and is engaged with the top portion of the spacer 6. The fixing screws 8 are inserted in through-holes of the spacer 6 and the lid 7 from above so that they penetrate through the external connection printed circuit board 3 and their tips are threadedly engaged with threaded holes (not shown) that are formed in the socket base 1. The IC is guided by the spacer 6 and is pressed from above by the fixing screws 8 fixing the lid 7.

Figure 4B:
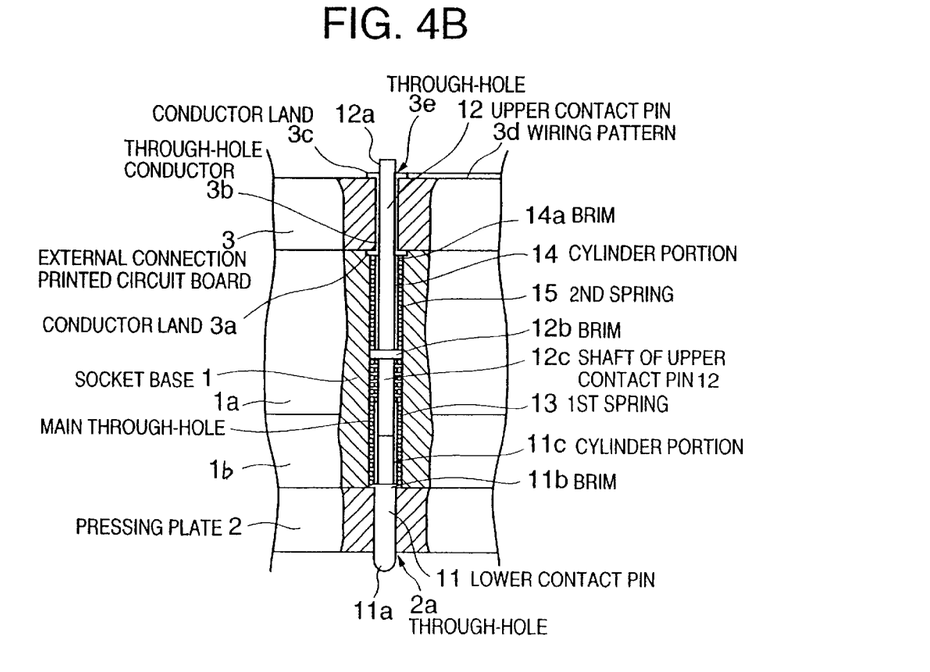
FIG. 4B is a partially sectional, enlarged side view of the main part of the IC socket of FIG. 4A.

Referring to FIG. 4B, the socket base 1 has a plurality of main through-holes formed at prescribed positions corresponding to the terminal arrangement of a compatible IC, each of the main through-holes having a predetermined diameter and extending in the thickness direction.

The pressing plate 2 has lower through-holes 2a formed at positions corresponding respectively to the main through-holes. The diameter of the lower through-holes 2a is smaller than that of the main through-holes. Therefore, a step is formed at the boundary between a main through-hole and a corresponding lower through-hole 2a.

The external connection printed circuit board 3 has upper plated through-holes 3e formed at positions corresponding respectively to the main through-holes. The diameter of the upper through-holes 3e is smaller than that of the main through-holes. Therefore, a step is formed at the boundary between a main through-hole and a corresponding upper through-hole 3e.

Around each of the upper through-holes 3e, a conductor land 3a and a conductor land 3c are formed on the bottom and upper surfaces of the external connection printed circuit board 3, respectively. The conductor land 3c for each of the upper through-holes 3e is connected to a corresponding interconnection of a wiring pattern 3d. Since the upper through-holes 3e are each plated, the conductor land 3a is electrically connected to the corresponding conductor land 3c through a through-hole conductor 3b for each upper through-hole. The other ends of the wiring pattern 3d are electrically connected to connection pins 10a of an external output connector (general-purpose connector) 10, which is fixedly provided on the outer periphery of the external connection printed circuit board 3. The conductor lands 3c and the wiring pattern 3d can be easily formed in one piece by a known etching technique for printed circuit board. Part or all of the wiring pattern 3d can be formed on the top or bottom surface of the external connection printed circuit board 3 by using a known plated through-hole formation technique.

Each of the upper through-holes 3e has an upper contact pin 12 movably inserted therein and electrically connected to the corresponding conductor lands 3a and 3c. Therefore, each upper contact pin 12 is electrically connected to a corresponding interconnection of the wiring pattern 3d, which is further connected to the external output connector 10.

As described before, the respective interconnections of the wiring pattern 3d electrically connect the conductor lands 3c and the connection pins 10a of the external output connector 10. This allows easy input/output of electrical signals between an external system and the BGA/LGA terminals of the IC via the general-purpose connector 10.

A lower contact pin 11 and an upper contact pin 12 are accommodated inside a corresponding main through-hole and are electrically connected to each other. The lower contact pin 11 and the upper contact pin 12 are biased by spring means and their tips 11a and 12a are thereby resiliently project, by prescribed lengths, from the bottom surface of the pressing plate 2 and the top surface of the external connection printed circuit board 3, respectively.

In this embodiment, the paired upper contact pin 12 and lower contact pin 11 are arranged coaxially and biased in such directions as to be separated from each other by biasing means 13 (here, coiled springs) that is also provided coaxially.

As shown in the enlarged sectional view of FIG. 4B, more specifically, an upper contact pin 12 is made of metal and is formed by, if necessary, gold-plating a rod-shaped member of brass, beryllium-copper, or the like having a prescribed length and being slightly smaller in diameter than the corresponding upper through-hole 3e. The upper contact pin 12 has a brim 12b formed at a middle position in the axial direction. The diameter of the brim 12b is slightly smaller than the inside diameter of the corresponding main through-hole. The upper contact pin 12 has a shaft 12c extending downward in the axial direction from the brim 12b.

On the other hand, a lower contact pin 12 is made of metal and is formed by, if necessary, gold-plating a rod-shaped member of brass, beryllium-copper, or the like having a prescribed length and being slightly smaller in diameter than the corresponding lower through-hole 2a. The lower contact pin 11 has a brim 11b formed at a middle position in the axial direction. The diameter of the brim 11b is slightly smaller than the inside diameter of the main through-hole.

The lower contact pin 11 has a cylinder portion 11c of a predetermined length extending upward (i.e., inward in the socket base 1) in the axial direction from the brim 11b. The cylinder portion 11c accommodates the shaft 12c slidably or in a loosely fit manner, in other words, the shaft 12c of the upper contact pin 12 is slidably inserted in the cylindrical hole of the cylinder portion 11c.

The upper contact pin 12 and the lower contact pin 11 are accommodated in the corresponding main through-hole in a state that they are engaged with each other and the shaft 12c is slidably inserted in the cylinder portion 11c. A first coiled spring 13 as a biasing means is mounted on the outer circumferential surfaces of the shaft 12c and the cylinder portion 11c. Both ends of the first coiled spring 13 are in contact with the brims 12b and 11b, whereby the first coiled spring 13 serves to separate them from each other.

Although in this embodiment the upper contact pin 12 and the lower contact pin 11 have the shaft 12c and the cylinder portion 11c, respectively, an inverted structure where the upper contact pin 12 and the lower contact pin 11 have a cylinder portion and a shaft, respectively, may be employed. The essential points are as follows:

1) one of the upper contact pin 12 and the lower contact pin 11 has a shaft extending inward in the axial direction from the brim;
2) the other of the upper contact pin 12 and the lower contact pin 11 has a cylinder portion that extends inward in the axial direction from the brim and accommodates the shaft slidably or in a loosely fit manner; and
3) a coiled spring is mounted on the outer circumferential surfaces of the shaft and the cylinder portion in such a manner that the respective ends of the coiled spring are in contact with the brims.

Further, the upper contact pin 12 is slidably inserted in an internal cylinder portion 14 that has a brim 14a at the upper end thereof. More specifically, the internal cylinder portion 14 is located above the brim 12b so as to be slidable with respect to the upper contact pin 12.

A second coiled spring 15 is mounted on the outer circumferential surface of the internal cylinder member 14. The respective ends of the second coiled spring 15 are in contact with the brim 14a of the internal cylinder portion 14 and the brim 12b of the upper contact pin 12 in such a compression state as to provide weaker biasing force than the first coiled spring 13 does.

As described above, the lower contact pin 11 has the brim 11b at a middle position in the axial direction. The upper contact pin 12 has the brim 12b at a middle position in the axial direction. The contact pins 11 and 12 are engaged with each other coaxially, and the first coiled spring 13 that is compressed and deformed between the brims 11b and 12b is mounted on the outer circumferential surfaces of the contact pins 11 and 12. In this manner, the individual parts are accommodated coaxially in the through-hole. With this structure, biased by the resilient force of the first coiled spring 13, the bottom tip 11a of the lower contact pin 11 projects from the bottom surface of the pressing plate 2 and the top tip 12a of the upper contact pin 12 projects from the external connection printed circuit board 3.

In this manner, the upper and lower contact pins 12 and 11 are electrically connected to each other in a stable manner. Even when vertical force is applied to the paired contact pins 12 and 11, they assure a reliable electrical connection between the IC located above the external connection printed circuit board 3 and the printed circuit board C below the pressing plate 2.

In this embodiment, the internal cylinder portion 14 is provided on the portion of the upper contact pin 12 that is located above the brim 12b in the axial direction. The second coiled spring 15 is provided on the outer circumferential surface of the internal cylinder portion 14 between the brim 14a of the internal cylinder portion 14 and the brim 12b of the upper contact pin shaft 12c Therefore, the brim 14a of the internal cylinder portion 14 is pressed against the conductor land 3a on the surface (back surface) of the external connection printed circuit board 3, providing a reliable electrical connection to the external connection printed circuit board 3. Since the biasing force of the compressed second coiled spring 15 is set weaker than that of the first coiled spring 13, it does not prevent the top tip of the upper contact pin 12 from projecting from the top surface of the external connection printed circuit board 3. According to currently-available accuracy, the above-described portions can be formed so as to be very thin: about 5 mm in terms of the total thickness in an assembled state.

As described before, the IC fixing means 9 of this embodiment is composed of the spacer 6, the lid 7 and the fixing screws 8 as shown in FIG. 4A, therefore, the IC fixing means 9 can deal with ICs that are different in height (thickness) by changing the thickness of the spacer 6. Alternatively, since the lower, central portion of the lid 7 projects downward and contacts the top surface of the IC, the IC fixing member 9 can deal with ICs that are different in height by switching among lids 7 whose central portions have different projection lengths. Further, the IC fixing member 9 can deal with ICs that are different in size (plan shape) by adjusting the size of the penetration space of the spacer 6.

When the IC socket 100 of this embodiment is used actually, the socket base 1 is fixed to the mounting printed circuit board C by positioning it at a prescribed position on the printed circuit board C, inserting the fixing screws 4 into through-holes of the printed circuit board C, and fastening the nuts 5 from below.

Then, an IC is accommodated in the central penetration space of the spacer 6, the lid 7 is engaged with the spacer 6 from above, the fixing screws 8 are inserted into the through-holes of the spacer 6 and the through-holes of the external connection printed circuit board 3 from above the lid 7, and the tips of the fixing screws 8 are threadedly engaged with the female screw holes that are formed in the top portion of the socket base 1, whereby the individual portions are fastened.

Once the IC socket 100 accommodating the IC is mounted on the printed circuit board C in the above manner, a prescribed operation of the printed circuit board C is enabled. In this state, if necessary, input/output of signals etc. can be performed with the terminal portions of the IC via the external connection connector 10. This makes it possible to recognize an actual operation state of the printed circuit board C and the IC from the outside, facilitating inspections etc. on the printed circuit board C.

In this embodiment the respective end portions of the interconnections of the wiring pattern are connected to the general-purpose integrated connector 10. As a simplified arrangement, the end portions of the interconnections of the wiring pattern are isolated and distributed in a staggered manner, for example, and terminal pins for simple contact (check pins) are provided thereon.

It goes without saying that capable of fixedly accommodating a prescribed BGA terminal IC inside, the IC socket 100 can be also used as a mere IC socket (original manner of use). Where only accommodation of an IC is intended, the external connection printed circuit board 3 having the above-described complex structure is not necessary; instead, a smaller-area insulating plate in which a number of through-holes of a prescribed diameter are formed in a prescribed arrangement may be used. Even in this case, the advantage that the whole IC socket is thin can still be obtained.

Figure 5:
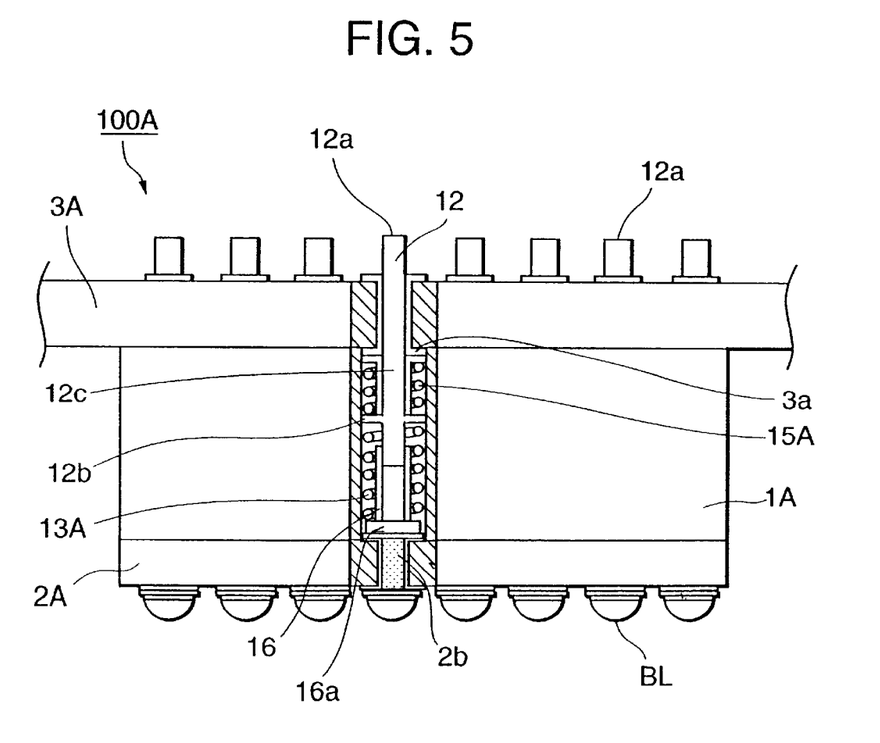
FIG. 5 is a partially sectional side view of an IC socket according to a second embodiment of the present invention.

FIG. 5 is a partially sectional side view showing the main part of an IC socket according to a second embodiment of the invention. FIG. 5 corresponds to FIG. 4B and does not show an IC fixing means. This IC socket 100A does not have means for fixing itself to a printed circuit board. Instead, the bottom surface thereof is provided with BGA terminals having solder balls. Therefore, the IC socket 100A can be mounted and fixed on a printed circuit board by soldering.

In the IC socket 100A according to the second embodiment, only an upper contact pin 12 of each main through-hole is biased upwardly by a combination of a first spring 13A and a second spring 15A. The top tip 12a of the upper contact pin 12 projects resiliently from the top surface of an external connection printed circuit board 3A (or an insulating plate in which only through-holes are formed).

The IC socket 100A is composed of a socket base 1A having a pressing plate 2A fixed to the bottom surface thereof and an external connection printed circuit board 3A fixed to the top surface thereof. The socket base 1A has a plurality of main through-holes formed therein in a prescribed arrangement (i.e., at positions corresponding to the terminal arrangement of the IC to be mounted). An IC fixing means for fixing a BGA IC on the external connection printed circuit board 3A at a prescribed position is similar to the IC fixing means 9 of the first embodiment as shown in FIG. 4A. Therefore, the IC fixing means is not shown in FIG. 5.

The socket base 1A is made of an insulating material such as a heat-resistant polymer and having a prescribed thickness and a shape (e.g., rectangular in cross-section) that is approximately equal to the plan view of an IC to be mounted. The pressing plate 2A is also made of an insulating material and is integrated with the socket base 1A.

The pressing plate 2A has a plurality of through-holes 2b formed therein at prescribed positions corresponding to the main through-holes. As described in the first embodiment, the diameter of each through-hole 2b is smaller than that of the corresponding main through-hole. Each of the through-holes 2b is filled with a conductor material to provide an electrical connection between conductor lands formed on the top and bottom surfaces of the pressing plate 2A. The conductor land formed on the bottom surface for each main through-hole has a solder ball BL formed thereon. The pressing plate 2A may be a general-purpose double-sided printed circuit board or a film circuit board.

The external connection printed circuit board 3A has a plurality of upper through-holes formed therein at prescribed positions corresponding to the main through-holes. As described in the first embodiment, the diameter of each upper through-hole is smaller than that of the corresponding main through-hole and thereby a step is formed at the boundary between them.

Around each of the upper through-holes, a bottom conductor land 3a and an upper conductor land are formed on the bottom and upper surfaces of the external connection printed circuit board 3A, respectively. As in the case of the first embodiment, the upper conductor land 3c for each of the upper through-holes is connected to a corresponding interconnection of a wiring pattern (not shown). Since the upper through-holes are each plated, the bottom conductor land 3a is electrically connected to the corresponding upper conductor land. Each of the upper through-holes has an upper contact pin 12 movably inserted therein and electrically connected to the corresponding conductor land 3a.

The upper contact pin 12 is approximately the same as in the first embodiment except for its axial dimension. The upper contact pin 12 has a shaft 12c which is a rod-shaped metal member having a prescribed length and a diameter that is slightly smaller than the inside diameter of the corresponding upper through-hole of the external connection printed circuit board 3A. The upper contact pin 12 has a brim 12b formed at a middle position in the axial direction. The diameter of the brim 12b is slightly smaller than the inside diameter of the corresponding main through-hole.

The upper contact pin 12 is slidably inserted in an internal cylinder member above the brim 12b. The second coiled spring 15A is mounted on the outer circumferential surface of the internal cylinder member. The internal cylinder member has the same function as the cylinder portion 14 of the first embodiment.

The lower contact pin 16 is a metal member shaped like a cylinder having a brim 16a at the lower end thereof. The diameter of the brim 16a is slightly smaller than the inside diameter of the corresponding main through-hole. The shaft 12c of the upper contact pin 12 is slidably fit in the cylinder of the lower contact pin 16.

The first coiled spring 13A and the second coiled spring 15A as a biasing means are accommodated in the corresponding main through-hole. They are coaxially mounted on the outer circumferential surfaces of the contact pins 12 and 16. Since the first coiled spring 13A presses both of the brims 12b and 16a outward, the two contact pins 12 and 16 are biased in such directions as to be separated from each other.

Each of the main through-holes accommodates a combination of the upper contact pin 12 and the lower contact pin 16, which are electrically connected to each other. The upper contact pin 12 is biased by spring means and its tip 12a is thereby resiliently project, by a prescribed length. from the top surface of the external connection printed circuit board 3A.

When the IC socket 100A of this embodiment is used. it is placed at a prescribed position of a printed circuit board (not shown) such that the solder balls BL of the IC socket 100A are each placed on the predetermined terminals of the printed circuit board. Then, the solder balls BL of the IC socket 100A are melted by heating in a reflow furnace or the like to make soldered connections.

An IC is accommodated in the same manner as in the first embodiment. The functions of the IC socket 100A are equivalent to those of the IC socket 100 in the first embodiment and hence are not be described here.

As described above, the present invention provides an IC socket allowing a surface-mount (BGA/LGA) IC to be properly accommodated and further allowing reduction in thickness and easy and reliable input/output of signals.

In other words, the IC socket according to the present invention is small in size and, in particular, thin and hence has no limitations on the mounting location. The IC socket can accommodate an IC with high reliability and is advantageous in the protection and replacement of an IC. The IC socket can easily lead out signal lines to the outside from the accommodated IC and hence can be utilized for tests of a circuit board before mounting of an IC as well as development of a circuit board. Further, the IC socket enables input/output of signals between the mounted IC and an external system in an operation state and hence can be utilized for inspections etc. of the IC and the circuit board.

What is claimed is:

1. An integrated circuit (IC) socket for electrically connecting terminals formed on a bottom surface of a surface-mount IC package to respective ones of predetermined electrodes of a printed circuit board, comprising:

a body member made of an insulating material, the body member having a top surface and a bottom surface thereof, wherein a plurality of-main through-holes are formed between the top surface and the bottom surface so that the main through-holes correspond to respective ones of the terminals of the surface-mount IC package;

a pair of an upper contact member and a lower contact member which are accommodated in each of the main through-holes and are electrically connected to each other so as to electrically connect the terminals of the surface-mount IC package to respective ones of the predetermined electrodes of the printed circuit board, wherein at least the upper contact member is slideably accommodated and biased to protrude from the top surface of the body member; and a circuit board member which enables input/output of electrical signals between the IC socket and an external system fixed to the top surface of the body member, the circuit board member having a plurality of upper through-holes corresponding to respective ones of the main through-holes, and further having a plurality of conductors which are electrically connected to the main through holes, wherein the upper contact member protrudes through a corresponding one of the upper through-holes by a predetermined length.

2. The IC socket of claim 1, wherein the upper contact member protrudes through the corresponding one of the upper through-holes and is electrically connected to a corresponding one of the conductors.

3. The IC socket according to claim 1, wherein both of the upper and lower contact members are slidably and coaxially accommodated in each of the main through-holes and biased by a biasing element in such directions as to be relatively separated from each other.

4. The IC socket according to claim 1, wherein the upper contact member is slidably and coaxially engaged with the lower contact member in each of the main through-holes and the upper contact member is biased by a biasing element in such directions as to be relatively separated from the lower contact member.

5. The IC socket according to claim 4, wherein the lower contact member has a contact tip thereof so as to make a contact with a corresponding one of the predetermined electrodes of the printed circuit board.

6. An integrated circuit (IC) socket for connecting input/output terminals of one of a BGA (Ball-Grid-Array) IC package and an LGA (Land-Grid-Array) which is accommodated inside the IC socket to respective ones of predetermined IC terminal connection electrodes on a mounting printed circuit board, comprising:

a socket base made of an insulating material to be disposed in an IC terminals connection region that is located at a predetermined position on a surface of the mounting printed circuit board;

socket fixing means for fixing the socket base to the mounting printed circuit board;

an external connection printed circuit board that is fixed to a top surface of the socket base; and IC fixing means for fixing a BGA IC package that is placed at a predetermined position on the external connection printed circuit board by pressing the BGA IC package from above, wherein the socket base comprises:

upper contact pins that are provided at positions corresponding to respective terminal positions of the BGA-type IC placed above the socket base, and that are biased individually inside the socket base and project, by a predetermined length, from the top surface of the socket base and pass through through-holes of the external connection printed circuit board; and lower contact pins that are electrically connected to the respective upper contact pins, and that are biased individually inside the socket base and reach a bottom surface of the socket base at positions corresponding to IC terminal connection electrodes provided on the mounting printed circuit board, and the external connection printed circuit board has the through-holes in which the respective upper contact pins are inserted and surface wiring portions that are insulated from each other, are electrically connected to the respective upper contact pins, and are provided on a surface of the external connection printed circuit board so as to extend to an outer periphery.

7. The IC socket according to claim 6, wherein an upper contact pin and a lower contact pin that are associated with each other are arranged coaxially and biased by biasing means in such directions as to be separated from each other.

8. The IC socket according to claim 7, wherein: the socket base is formed, in a thickness direction, in a prescribed arrangement, with a plurality of through-holes each of which has an upper portion having a constant diameter and a lower portion having a smaller diameter with a step formed inbetween;

a surface of the external connection printed circuit board is formed with conductor lands at positions corresponding to the respective through-holes in a state that the external connection printed circuit board is fixed to the socket base in a prescribed manner, the lands being connected to one ends of the respective wiring portions, the through-holes having a diameter smaller than the constant diameter being formed approximately at central positions of the respective lands; and each of the lower contact pins has a brim at a middle position in an axial direction, each of the upper contact pins has a brim at a middle position in the axial direction, a first coiled spring is interposed between the brims in a compressed and deformed state and accommodated in the through-hole coaxially, being biased by resilient force of the first coiled spring, a bottom tip of the lower contact pin projects from the bottom surface of the socket base and a top tip of the upper contact pin projects from a top surface of the connection printed circuit board.

9. The IC socket according to claim 8, wherein:

one of the upper contact pin and the lower contact pin has a shaft extending inward in the axial direction from the brim;

the other contact pin has a cylinder portion that extends inward in the axial direction from the brim and accommodates the shaft slidably or in a loosely fit state; and the first coiled spring is mounted on outer circumferential surfaces of the shaft and the cylinder portion and both ends of the first coiled spring are in contact with the respective brims.

10. The IC socket according to claim 9, further comprising:

an internal cylinder member that is slidably mounted on an outer circumferential surface of a portion of the upper contact pin located above the brim in the axial direction and has a brim at an upper end in the axial direction; and a second coiled spring that is mounted on an outer circumferential surface of the internal cylinder member and provided in a compressed state in such a manner that both ends of the second coiled spring are brought into contact with the brim of the upper contact pin and the brim of the internal cylinder member by biasing force weaker than that of the first coiled spring.

11. The IC socket according to claim 6, further comprising a connector that is provided at the outer periphery of the external connection printed circuit board, wherein the wiring portions are electrically connected to respective connection pins of the connector.

* * * * *